United States Patent [19]

Banholzer et al.

[11] Patent Number: 5,762,748
[45] Date of Patent: Jun. 9, 1998

[54] LID AND DOOR FOR A VACUUM CHAMBER AND PRETREATMENT THEREFOR

[75] Inventors: Thomas Banholzer; Dan Marohl, both of San Jose; Avi Tepman, Cupertino; Donald M. Mintz, Sunnyvale, all of Calif.

[73] Assignee: Applied Materials, Inc, Santa Clara, Calif.

[21] Appl. No.: 658,784

[22] Filed: Jun. 5, 1996

Related U.S. Application Data

[60] Continuation of Ser. No. 335,611, Nov. 8, 1994, Pat. No. 5,565,058, which is a division of Ser. No. 936,433, Aug. 27, 1992, Pat. No. 5,401,319.

[51] Int. Cl.$^6$ .................. H05H 1/00; C23C 16/00
[52] U.S. Cl. .................. 156/345; 118/715; 118/723 R; 204/298.01
[58] Field of Search .................. 156/345; 118/715, 118/723 R, 723 E; 204/298.01, 298.31, 298.02, 298.34

[56] References Cited

U.S. PATENT DOCUMENTS

| | | | |
|---|---|---|---|
| 4,466,872 | 8/1984 | Einbinder | 118/715 X |
| 4,491,540 | 1/1985 | Larker et al. | 252/628 |
| 5,017,439 | 5/1991 | Brar et al. | 428/629 |
| 5,051,375 | 9/1991 | Sakata et al. | 437/10 |
| 5,202,008 | 4/1993 | Talieh et al. | 204/192.32 |
| 5,233,144 | 8/1993 | Morino et al. | 219/10.55 E |

FOREIGN PATENT DOCUMENTS

| | | | |
|---|---|---|---|
| 446657 | 9/1991 | European Pat. Off. | C23C 14/22 |

OTHER PUBLICATIONS

Lee et al, "Adhesion Studies of Magnetron–Sputtered Copper films . . . " 2194, Thin Solid Films, 185 (1990) Feb. No. 1, Lausanne, CH pp. 35–55.

*Primary Examiner*—Thi Dang
*Attorney, Agent, or Firm*—Birgit E. Morris; Donald Verplancken

[57] ABSTRACT

Replaceable parts for a vacuum chamber including an aluminum lid and a quartz door and shield, are treated to clean and roughen their surfaces to increase adhesion of materials deposited thereon during substrate processing in said chamber, thereby reducing downtime of the equipment. The parts can be chemically cleaned, rinsed to remove the chemicals and dried in a first step; subjected to bead blasting to roughen the surface of the part and improve adhesion thereon of deposited material; in a succeeding step the part be cleaned ultrasonically to remove all loose particles; and in a last step the parts rinsed and dried to remove moisture, prior to packaging or using the part. A novel single-piece machined aluminum lid has an extension wall from a first surface that fits into the door of the chamber, and an overlying portion of said first surface that sealingly engages the door when the lid is closed.

1 Claim, 1 Drawing Sheet

LID AND DOOR FOR A VACUUM CHAMBER AND PRETREATMENT THEREFOR

This is a continuation of application Ser. No. 08/335,611 filed Nov. 8, 1994, now U.S. Pat. No. 5,565,058 which is a division of Ser. No. 07/936,433 filed Aug. 27, 1992, now U.S. Pat. No. 5,401,319 issued Mar. 28, 1995.

This invention relates to improved replaceable parts for a vacuum chamber. More particularly, this invention relates to replaceable parts for a vacuum etch chamber that are pre-treated to extend the time for replacement.

BACKGROUND OF THE INVENTION

Vacuum chambers are well known and are employed in the semiconductor industry to etch and deposit thin films and form contacts in semiconductor substrates during manufacture of, inter alia, integrated circuits. State-of-the art processing chambers form a part of a system able to condition and preclean substrates for vacuum processing and process them without leaving a vacuum environment.

However, a substrate preclean step, while it is effective in removing material adhered to the surface of the substrate, distributes this material on other surfaces within the vacuum chamber, e.g., on the walls or shields, lid and door of the chamber. In time there is a build up of this material that causes flakes to form on these surfaces that can deposit onto the substrate surface. At that point the chamber must be disassembled for cleaning.

The present lid for a vacuum etch chamber comprises a two-piece aluminum lid separated by an RF gasket, which is a low resistance contact for the 60 MHz RF power supply for the vacuum chamber. Two aluminum plates are screwed together by a plurality of screws that fasten the two plates together so they make good contact to the RF gasket therebetween. As material builds up on the lid however, as described hereinabove, it must be periodically cleaned to remove the built up material. This is generally done by a wet chemical cleaning process which requires that the lid be disassembled, the screws removed, the lid cleaned and then the lid be re-assembled. However, the act of assembly, e.g., inserting and fastening the screws, itself creates particles, so that the chamber is not clean, i.e., free of particles, even after the cleaning step. Other parts of the vacuum chamber, such as the door for the lid and a shield around the substrate support that prevents material from depositing on the walls of the chamber, must also be periodically cleaned; this adds to the downtime of the equipment and consequently increases costs of manufacture.

Thus it would be desirable to have a vacuum chamber lid that does not have to be disassembled and assembled again for cleaning; further it would be desirable to pre-treat replaceable parts for a vacuum chamber so that particles generated in the vacuum chamber that adhere to the lid, door and shield surfaces have improved adherence to these surfaces with the result that the time between cleaning cycles can be extended, thereby reducing downtime of the equipment.

SUMMARY OF THE INVENTION

The present invention provides a novel lid and door for a vacuum chamber comprising a single, machined aluminum plate that sealingly engages a quartz ring or door, and, when the lid and door to the vacuum chamber are closed, in turn fits inside a shield surrounding the substrate support. The lid, shield and door replaceable parts are pre-treated so that particles generated within the chamber during precleaning of the substrate and processing thereof will better adhere to these surfaces, allowing more substrates to be processed before the vacuum chamber needs to be taken apart and cleaned or parts replaced. This pre-treatment comprises a bead blasting step that creates an irregular surface in the aluminum and quartz materials of the replaceable parts, e.g., lid, door and shield respectively, to which materials or particles generated in the chamber adhere better than on a smooth surface, followed by removal of all particles remaining on the surface after the bead blasting step by an ultrasonic cleaning step of the replaceable parts. This pre-treatment produces aluminum and quartz door/lid/shield combinations that have a long lifetime in a vacuum processing chamber.

DETAILED DESCRIPTION OF THE INVENTION

Figure 1:
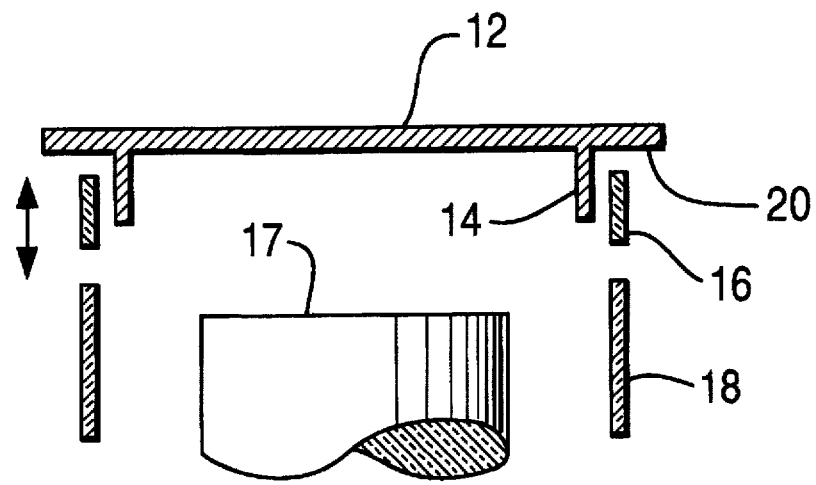
FIG. 1 is a cross sectional view of a replaceable lid, door and shield for a vacuum processing chamber.

FIG. 1 illustrates the novel one piece aluminum lid of the invention, a quartz door therefor and a quartz substrate support shield for a vacuum processing chamber. The lid is opposed to the cathode within the chamber on which the substrate to be treated is placed during processing. The lid and door of the invention have been pre-treated in accordance with the process of the invention.

The extension wall 14 fits inside a quartz door 16. When the lid 14 is in place and the door 16 is closed, the door 16 fits atop a quartz shield 18 which is shaped to surround the cathode 17 onto which the substrate to be processed is located during processing. The door 16 is raised and lowered with lid 12 stationary by an externally driven actuator. At the same time the door 16 is raised and lowered, ceramic fingers (not shown), which pass through slots in the quartz shield 18, raise and lower the substrate onto the cathode 17. This occurs during the transfer of substrates into and out of the chamber. The fixed quartz shield 18 serves to prevent material etched from the substrate from adhering to the walls of the vacuum chamber (not shown). The lid 12 also has an overlying portion 20 of said first surface that contacts and seals the door during processing. A suitable O-ring seal (not shown) conventionally is used to seal the chamber when a vacuum is drawn.

The aluminum lid 12 and the quartz door 16 and shield 18 are pre-treated in accordance with the cleaning process of the invention, described in greater detail hereinbelow.

The novel lid of the invention requires no screws, thereby generating fewer particles in a vacuum preclean or processing chamber; has a pre-treated surface to which particles generated during processing better adhere; does not require an RF gasket, resulting in better grounding of the lid; and no assembly or disassembly of the lid is required for cleaning or replacement. A simple replacement of the lid and the door can be effected when required, reducing the downtime of the equipment. The lid, door and shield also can be readily re-cleaned and re-treated for reuse in any suitable vacuum chamber. Aluminum parts and quartz parts are recycle-cleaned by a combination of bead blasting and chemical cleaning steps. The last step in both cases is a bead blasting step followed by ultrasonic processing in deionized water, rinsing and drying as explained further hereinbelow.

The pretreatment process of the invention comprises a bead blasting step followed by an ultrasonic cleaning step.

The bead blasting step treatment of the aluminum lid and the quartz door is suitably effected by bombarding the lid, the door and the shield using about 80 psi of pressure and aluminum oxide powder having a rather coarse grit, suitably about 36–80 grit in size. Bead blasting can be carried out in commercially available bead blasting equipment. The bead blasting powder particles must be large enough to make the aluminum surface of the lid and the quartz door and shield surfaces slightly irregular or roughened. The machined one-piece aluminum lid can withstand bead blasting with coarser grit size material because it is thicker than the prior art two-plate aluminum sheet metal lid, and thus it is more durable. The irregular surfaces, on a microscopic scale, will enhance interface crack propagation of material that may be deposited during substrate processing. The surface irregularities will result in the breaking up of the deposited films into sections that are small with respect to flake sizes, which significantly hinders flaking. In addition, the irregular or roughened surfaces have an increased surface area to which material can deposit, increasing the amount of deposited material that can be accommodated.

The bead blasting step is followed by an ultrasonic cleaning step that removes all loose particles on the surfaces of the lid, door and shield, whether they are due to particles remaining from the bead blasting, or minute particles of aluminum, quartz, dust particles and the like. The lid, door and shield are first rinsed with deionized water and immersed in an ultrasonic cleaner filled with deionized water. Suitable ultrasonic cleaners are commercially available and are generally set to run at power densities of from about 35–70 Watts/gallon using a chamber containing about 10 gallons of deionized water for several minutes. As soon as the ultrasonic generator is turned on, a cloud of formerly embedded solid residue is seen to form over the bead blasted surfaces from which it originated. This cloud quickly dissipates and the solid material removed either remains in aqueous suspension or settles out. Thus, most of the activity of ultrasonic processing occurs during the initial few seconds of treatment. Treatment is usually continued for about 5 minutes however, in order to assure thorough removal of all loose solid material. The parts are then thoroughly rinsed with hot deionized water to ensure that no particles remain on the surfaces of the treated aluminum and quartz parts.

Lastly, the aluminum lid and quartz door and shield parts are dried to remove all moisture from their surfaces. Suitably the parts can be blown dry with filtered air or nitrogen and then lightly baked, e.g., at about 60° C. for one-half hour in filtered air atmosphere to remove all moisture from the parts. The cleaned parts can then be packed for shipment.

In a preferred cleaning process, prior to the bead blasting step the parts are chemically cleaned to remove surface contamination, such as oxides from the aluminum and organics from the quartz surfaces. A suitable chemical cleaning solution for ceramics for example can be ⅓ nitric acid, ⅓ hydrofluoric acid and ⅓ water. Dipping the part in the chemical cleaning solution for about 15 seconds is generally sufficient. The part is then rinsed with deionized water to remove the chemicals and blown dry using clean, filtered air or nitrogen.

Figure 2:
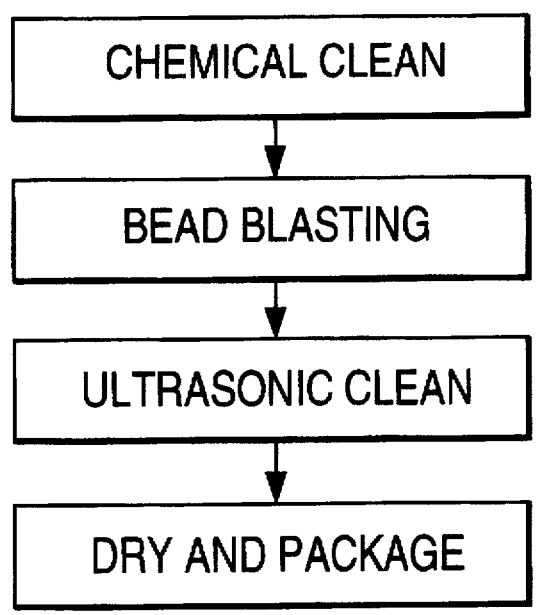
FIG. 2 is a flow chart for the process of the invention.

FIG. 2 is a flow chart of the preferred embodiment of the process of the invention, showing the chemical clean first step, followed by a bead blasting step, an ultrasonic cleaning step, and lastly the part finished by rinsing and drying and packaging the part.

Treating the lid and quartz parts of the vacuum chamber in accordance with the process of the invention, and utilizing the simplified, sturdier lid of the present invention, results in a cleaner vacuum chamber, one that can process more substrates than prior art chamber, reducing downtime of the equipment, and also provides a fast and low cost method of cleaning the chambers, and replacing the above-described parts.

Although the above invention has been described in terms of certain presently preferred embodiments, one skilled in the art will know of alternative embodiments of processing and equipment which are meant to be included herein. For example, although semiconductor substrates are generally silicon wafers which are circular in cross section, resulting in shields and cathode supports that are also circular in cross section, other substrates such as rectangular glass plates can also be employed. Other materials can be substituted for aluminum, such as stainless steel; and other cleaning and rinsing steps inserted into the process for particular results. The invention is only meant to be limited by the appended claims.

We claim:

1. A single-piece machined aluminum lid for a vacuum chamber having a vertically movable door in a sidewall thereof, said lid having a single perpendicular extension wall extending downwardly from said lid and a first surface that overlies and sealingly engages said door when the lid is closed so that the lid extension wall is inside of said door, wherein said lid is treated by bead blasting said first surface to roughen it, then ultrasonically cleaning it to remove surface particles and then rinsing and drying the lid.

* * * * *